US012796351B2

(12) United States Patent
Akiyama et al.

(10) Patent No.: US 12,796,351 B2
(45) Date of Patent: Nov. 10, 2026

(54) SUBSTRATE PROCESSING METHOD AND SUBSTRATE PROCESSING APPARATUS

(71) Applicant: Tokyo Electron Limited, Tokyo (JP)

(72) Inventors: Koji Akiyama, Yamanashi (JP); Philippe Gaubert, Yamanashi (JP); Hajime Nakabayashi, Yamanashi (JP); Chihiro Tamura, Yamanashi (JP); Hisashi Warashina, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 524 days.

(21) Appl. No.: 18/273,116

(22) PCT Filed: Jan. 13, 2022

(86) PCT No.: PCT/JP2022/000913

§ 371 (c)(1),
(2) Date: Jul. 19, 2023

(87) PCT Pub. No.: WO2022/158365

PCT Pub. Date: Jul. 28, 2022

(65) Prior Publication Data

US 2024/0304439 A1 Sep. 12, 2024

(30) Foreign Application Priority Data

Jan. 20, 2021 (JP) ................................ 2021-007405

(51) Int. Cl.

| | |
|---|---|
| ***H10P 14/60*** | (2026.01) |
| ***C23C 8/10*** | (2006.01) |
| ***H10P 14/692*** | (2026.01) |
| ***H10W 42/00*** | (2026.01) |

(52) U.S. Cl.
CPC ............ *H10P 14/6314* (2026.01); *C23C 8/10* (2013.01); *H10P 14/6939* (2026.01); *H10P 14/69392* (2026.01); *H10P 14/69395* (2026.01); *H10W 42/121* (2026.01)

(58) Field of Classification Search
CPC .. H10P 14/40; H10P 14/6314; H10P 14/6939; H10P 14/69392; H10P 14/69395; H10P 72/0616; H10W 42/121; C23C 8/10
See application file for complete search history.

(56) References Cited

U.S. PATENT DOCUMENTS 5,834,374 A * 11/1998 Cabral, Jr. .............. H01L 24/10 257/E21.582
6,808,952 B1 * 10/2004 Sniegowski ........ B81C 1/00666 438/48
10,134,689 B1 * 11/2018 Sridharan ............ H01L 23/562
(Continued)

FOREIGN PATENT DOCUMENTS

JP H9-045680 A 2/1997
JP 2017179498 A * 10/2017 .......... H01L 23/532

*Primary Examiner* — Christine S. Kim
*Assistant Examiner* — Tien Tran
(74) *Attorney, Agent, or Firm* — Nath, Goldberg & Meyer; Jerald L. Meyer; Tanya E. Harkins

(57) ABSTRACT

A substrate processing method includes: forming a metal film, which changes in volume when the metal film is oxidized, on a rear surface of a substrate; forming an oxide film, through which oxygen permeates, on a front surface of the metal film; and applying stress to the substrate by oxidizing the metal film.

16 Claims, 11 Drawing Sheets

(56) References Cited

U.S. PATENT DOCUMENTS

| | | | | |
|---|---|---|---|---|
| 2017/0162522 | A1* | 6/2017 | Chang | H01L 23/562 |
| 2020/0370172 | A1* | 11/2020 | Moriya | C23C 16/16 |
| 2021/0183993 | A1* | 6/2021 | Kim | H10D 1/692 |
| 2023/0243040 | A1* | 8/2023 | Li | C23C 28/345<br>427/404 |

* cited by examiner

SUBSTRATE PROCESSING METHOD AND SUBSTRATE PROCESSING APPARATUS

This is a National Phase Application filed under 35 U.S.C. 371 as a national stage of PCT/JP2022/000913, filed Jan. 13, 2022, an application claiming the benefit of Japanese Application No. 2021-007405, filed Jan. 20, 2021, the content of each of which is hereby incorporated by reference in its entirety.

TECHNICAL FIELD

The present disclosure relates to a substrate processing method and a substrate processing apparatus.

BACKGROUND

It is known that a film for applying stress to a semiconductor substrate is provided on the rear surface of the semiconductor substrate. Patent Document 1 discloses a method of manufacturing a semiconductor device in which warping of a substrate is reduced by depositing an insulating film having tensile stress on the rear surface of the semiconductor substrate.

PRIOR ART DOCUMENTS

Patent Documents

Patent Document 1: Japanese Laid-Open Patent Publication No. H09-45680

In an aspect, the present disclosure provides a substrate processing method and a substrate processing apparatus that apply stress to a substrate.

SUMMARY

In order to solve the above problems, an aspect provides a substrate processing method including: forming a metal film, which changes in volume when oxidized, on a rear surface of a substrate; forming an oxide film, through which oxygen permeates, on a front surface of the metal film; and applying stress to the substrate by oxidizing the metal film.

According to an aspect, the present disclosure is able to provide a substrate processing method and a substrate processing apparatus that apply stress to a substrate.

DETAILED DESCRIPTION

Figure 1:
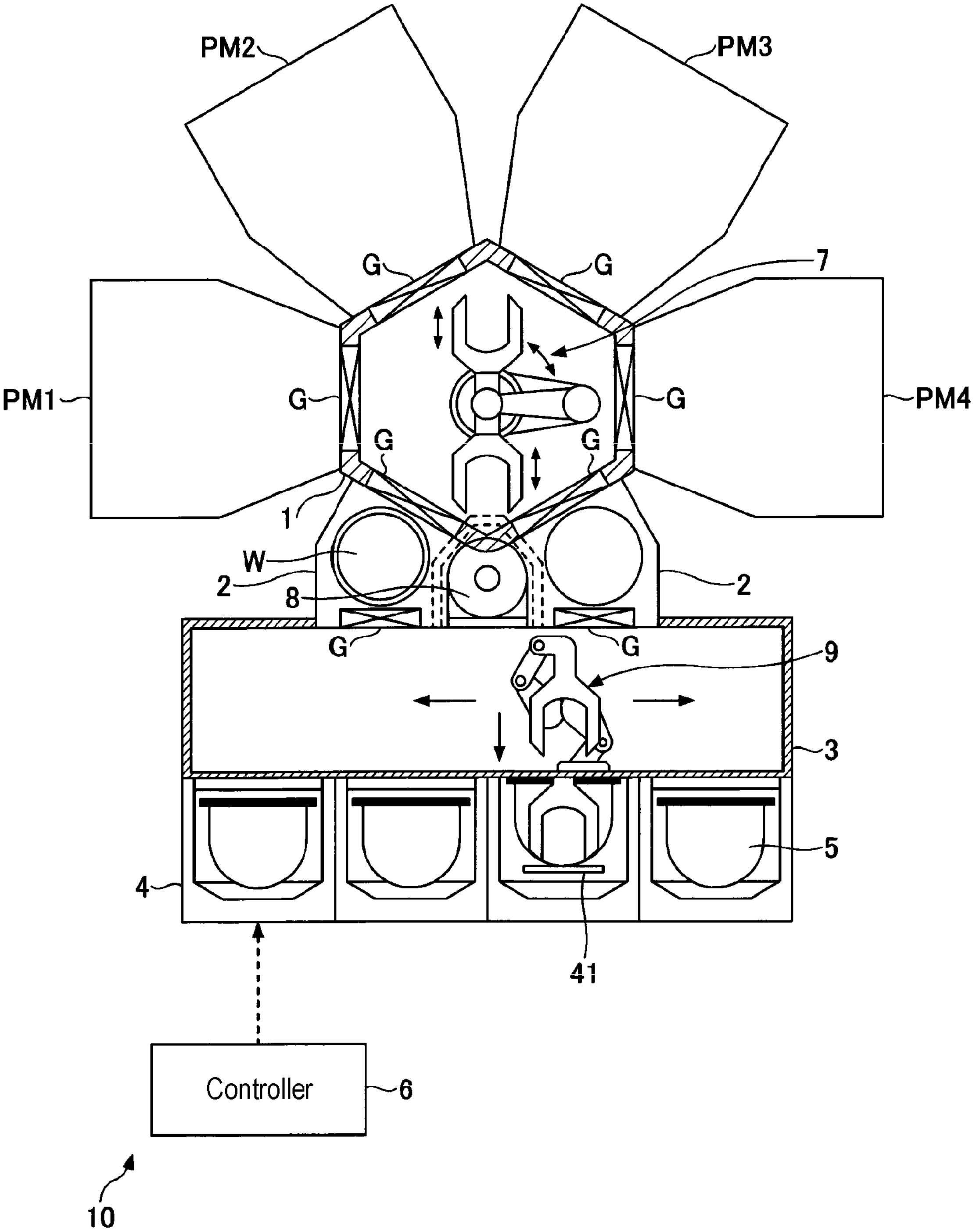
FIG. 1 is a configuration view illustrating an example of a substrate processing apparatus according to an embodiment.

Hereinafter, embodiments of the present disclosure will be described with reference to the accompanying drawings. In each of the drawings, the same components may be denoted by the same reference numerals, and redundant descriptions thereof may be omitted.

<Substrate Processing Apparatus 10>

A substrate processing apparatus 10 according to an embodiment will be described with reference to FIG. 1. FIG. 1 is a configuration view illustrating an example of the substrate processing apparatus 10 according to an embodiment.

The substrate processing apparatus 10 includes a vacuum transport chamber 1 configured to transport a wafer W, which is an example of a semiconductor substrate, the vacuum transport chamber 1 being maintained in a vacuum, and a plurality of processing modules, each of which is hermetically connected to the periphery of the vacuum transport chamber 1 to perform a predetermined process on the wafer W. In this example, for example, four processing modules are provided, but one or more processing modules may be provided. Hereinbelow, the four processing modules will be referred to as processing chambers PM1, PM2, PM3, and PM4, and will be collectively referred to as processing chambers PM. The four processing chambers PM1 to PM4 and two load-lock chambers 2 are connected to respective sides of a hexagonal vacuum transport chamber 1.

Predetermined processes are performed on a substrate W in the processing chambers PM1 to PM4. For example, the processes performed in the processing chambers PM1 to PM4 may be film formation and oxidation-reduction. The processing chamber PM will be described later with reference to FIGS. 2 and 3.

Inside the vacuum transport chamber 1, a substrate transport mechanism 7 configured to transport a substrate W is provided. The substrate transport mechanism 7 transports substrates W to the processing chambers PM1 to PM4 and the load-lock chambers 2.

The load-lock chambers 2 are hermetically connected to the vacuum transport chamber 1 and switch the internal atmospheres thereof between a vacuum atmosphere and an atmospheric atmosphere. In the present embodiment, two load-lock chambers 2 are provided, but the present disclosure is not limited thereto.

A common atmospheric transport chamber 3 configured to transport a substrate W in the atmospheric atmosphere is hermetically connected to the two load-lock chambers 2. In the atmospheric transport chamber 3, stages of load ports 4 for mounting a FOUP 5 accommodating, for example, 25 substrates W are provided at a plurality of locations. In the present embodiment, the stages are provided at four locations, but the present disclosure is not limited thereto. A pressing mechanism 41 functions to press the FOUP 5 on each stage against the atmosphere transport chamber 3 side.

An alignment mechanism 8 configured to align a substrate W is installed between the two load-lock chambers 2.

Inside the atmospheric transport chamber 3, a substrate transport mechanism 9 configured to transport a substrate W is provided. The substrate transport mechanism 9 transports substrates W to the load-lock chambers 2, the FOUPs 5 of the load ports 4, and the alignment mechanism 8.

Gate valves G are provided between the vacuum transport chamber 1 and the processing chambers PM1 to PM4, between the vacuum transport chamber 1 and the load-lock chambers 2, and between the load-lock chambers 2 and the atmospheric transport chamber 3, respectively, and substrates W are transported in an airtight manner by opening and closing the valve G.

The substrate processing apparatus 10 having this configuration includes, for example, a controller 6 configured with a computer. The controller 6 controls the entire substrate processing apparatus 10. The controller 6 includes a memory and a CPU, and the memory stores programs and recipes used for a process in each of the processing chambers PM. The programs includes a program related to an input operation or display of processing parameters. In the recipes, process conditions such as the temperatures to which the processing chambers PM are heated, processing procedures, and transport paths of wafers W are set.

The CPU transports, by using the substrate transport mechanism 9 and the substrate transport mechanism 7, the substrates W taken out from a FOUP 5 to the plurality of processing chambers PM along a predetermined route according to the programs and recipes stored in the memory. Then, the CPU executes predetermined processes in respective processing chambers PM based on the process conditions set in the recipes. The programs may be stored in a storage, such as a computer storage medium (e.g., a flexible disk, a compact disk, a hard disk, or a magneto-optical (MO) disk), and installed in the controller 6, or may be downloaded by using a communication function.

An unprocessed substrate W carried out from a FOUP 5 is transported to the load-lock chambers 2 by the substrate transport mechanism 9. Next, the unprocessed substrate W is transferred to a processing chamber PM by the substrate transport mechanism 7. A desired process (e.g., film formation or the like) is performed on the substrate W in the process chamber PM. The substrate W processed in the processing chamber PM may be transported to another processing chamber PM by the substrate transport mechanism 7 to be further processed. The processed substrate W is returned to the FOUP 5 via the load-lock chamber 2.

Figure 2:
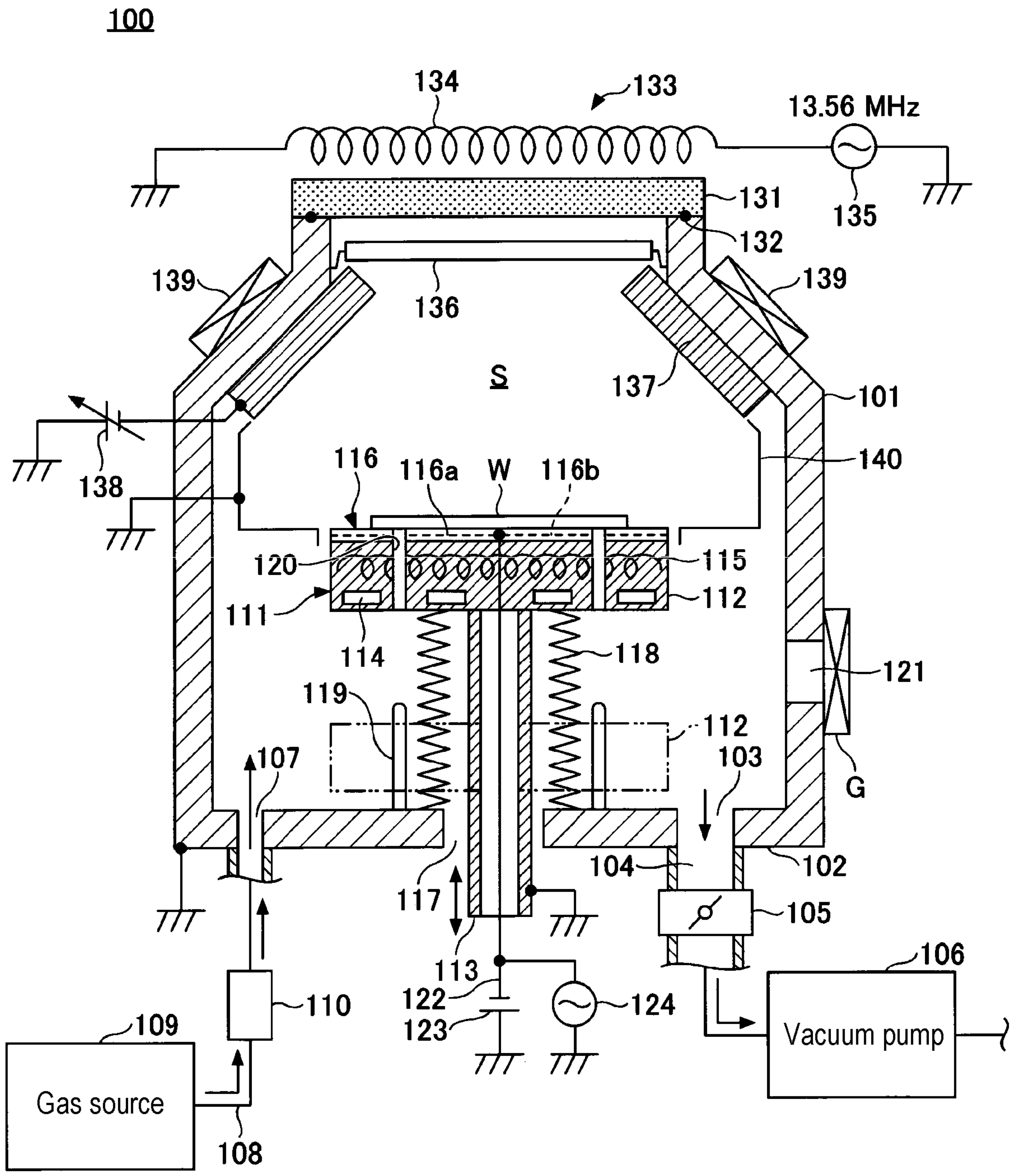
FIG. 2 is an example of a cross-sectional view of a film forming apparatus.

Next, a film forming apparatus 100 will be described as an example of the processing chamber PM. Here, a plasma sputtering apparatus will be described as an example of the film forming apparatus 100. FIG. 2 is an example of a cross-sectional view of the film forming apparatus 100.

The film forming apparatus 100 has a grounded processing container 101 made of metal such as aluminum. A bottom portion 102 of the processing container 101 is provided with an exhaust port 103 and a gas introduction port 107. An exhaust pipe 104 is connected to the exhaust port 103. A throttle valve 105 that performs pressure adjustment and a vacuum pump 106 are connected to the exhaust pipe 104. A gas supply pipe 108 is connected to the gas introduction port 107. A gas source 109 configured to supply a plasma excitation gas, such as Ar gas or another necessary gas, such as $N_2$ gas, is connected to the gas supply pipe 108. A gas controller 110 including a gas flow controller, a valve, and the like is interposed in the gas supply pipe 108.

A placement mechanism 111, on which a substrate W as a substrate to be processed is placed, is provided within the processing container 101. The placement mechanism 111 includes a disk-shaped stage 112 and a hollow cylindrical column 113 that supports the stage 112. The stage 112 is made of a conductive material, such as an aluminum alloy, and is grounded via the column 113. A cooling jacket 114 is provided inside the stage 112 and a coolant is supplied in the cooling jacket 114 to cool the stage 112. In the stage 112, a resistance heater 115 covered with an insulating material is embedded on the cooling jacket 114. By controlling the supply of the coolant to the cooling jacket 114 and the power feeding to the resistance heater 115, the temperature of the substrate is controlled to a predetermined temperature.

On the top surface side of the stage 112, an electrostatic chuck 116 configured to electrostatically attract a substrate W is provided, and the electrostatic chuck 116 is constructed by embedding an electrode **116*b* in a dielectric member 116*a*. The lower portion of the column 113 penetrates an insertion hole 117 formed in the central portion of the bottom portion 102 of the processing container 101 and extends downward. The column 113 is configured to be movable upward and downward by a lifting mechanism (not illustrated), whereby the entire placement mechanism 111** is raised and lowered.

An extendable metal bellows 118 is provided to surround the column 113. The upper end of the metal bellows 118 is bonded to the bottom surface of the stage 112. The lower end of the metal bellows 118 is bonded to the top surface of the bottom portion 102 of the processing container 101 to allow the placement mechanism 111 to move upward and downward while maintaining airtightness inside the processing container 101.

On the bottom portion 102, for example, three (only two are illustrated) support pins 119 are vertically provided upward. In addition, pin insertion holes 120 are formed in the stage 112 to correspond to the support pins 119. When the stage 112 is lowered, the upper end portions of the support pins 119, which penetrate the pin insertion holes 120, receive the substrate W to be capable of transferring the substrate W with a transport arm (not illustrated) that enters from the outside. A carry-in/out port 121 is provided in the lower side wall of the processing container 101 to allow the transport arm to enter the processing container, and the carry-in/out port 121 is provided with a gate valve G configured to be openable and closable.

A power source 123 for chuck is connected to an electrode **116*b* of the electrostatic chuck 116 via a power feeding line 122. By applying a DC voltage from the power source 123 for chuck to the electrode 116*b*, the substrate W is attracted and held by an electrostatic force. A radio frequency ("RF") power source 124 for bias is connected to the power feeding line 122 and supplies RF power for bias to the electrode 116*b* of the electrostatic chuck 116 via the power feeding line 122**, so that the bias power is applied to the substrate W. The frequency of this RF power is preferably 400 kHz to 60 MHz, for example, 13.56 MHz.

On the other hand, a transmission plate 131 made of a dielectric material is airtightly provided on the ceiling of the processing container 101 with a sealing member 132 interposed therebetween. A plasma generation source 133 is provided above the transmission plate 131 to generate a plasma in the processing space S in the processing container 101 by plasmatizing the plasma excitation gas.

The plasma generation source 133 has an induction coil 134 provided corresponding to the transmission plate 131. The induction coil 134 is connected to an RF power source 135 of, for example, 13.56 MHz for plasma generation, and RF power is introduced into the processing space S through the transmission plate 131 to form an induced electric field.

Immediately below the transmission plate 131, a baffle plate 136 made of metal is provided for diffusing the introduced RF power. Below the baffle plate 136, for example, a target 137 made of Cu or a Cu alloy and having an annular (a truncated cone shell shape) cross section inclined inward is provided to surround the side of the upper portion of the processing space S, and the target 137 is connected to a voltage-variable DC power source 138 for the target, which applies DC power for attracting Ar ions. An AC power source may be used instead of the DC power source.

In addition, a magnet 139 is provided on the outer peripheral side of the target 137. The target 137 is sputtered by Ar ions in the plasma, sputtered particles are released, and many of these particles are ionized when passing through the plasma.

Under the target 137, a cylindrical protective cover member 140 made of, for example, aluminum or copper is provided to surround the processing space S. This protective cover member 140 is grounded. The inner end portion of the protective cover member 140 is provided to surround the outer peripheral side of the stage 112.

In the film forming apparatus configured as described above, a substrate W is carried into the processing container 101, placed on the stage 112 such that the surface of the substrate W on which film formation is to be performed (the rear surface of the substrate, which will be described later) faces the processing space S, and attracted by the electrostatic chuck 116, and the following operations are performed under the control of the controller 6. At this time, the temperature of the stage 112 is controlled by controlling the supply of coolant to the cooling jacket 114 and the power feeding to the resistance heater 115 based on the temperature detected by a thermocouple (not illustrated).

First, the interior of the processing container 101 is maintained at a predetermined degree of vacuum by controlling the throttle valve 105 while causing Ar gas to flow into the processing container 101, which is brought into a predetermined vacuum state by operating the vacuum pump 106, at a predetermined flow rate by operating the gas controller 110. Thereafter, DC power is applied to the target 137 from the DC power source 138, and RF power (plasma power) is supplied to the induction coil 134 from the RF power source 135 of the plasma generation source 133. On the other hand, RF power for bias is supplied to the electrode **116*b* of the electrostatic chuck 116 from the RF power source 124** for bias.

As a result, in the processing container 101, an argon plasma is formed by the RF power supplied to the induction coil 134 to generate argon ions, and these ions are attracted to the DC voltage applied to the target 137 and collide with the target 137, which is sputtered to emit particles. At this time, the amount of released particles is optimally controlled by the DC voltage applied to the target 137.

In addition, most of the particles from the sputtered target 137 are ionized when passing through the plasma, and the ionized particles and electrically neutral atoms are mixed and scattered downward. At this time, the particles can be ionized with high efficiency by increasing the pressure inside the processing container 101 to some extent and thereby increasing the plasma density. The ionization rate at this time is controlled by the RF power supplied from the RF power source 135.

When the ions enter the region of an ion sheath having a thickness of several millimeters formed on the surface of the substrate W by RF power for bias applied to the electrode **116*b* of the electrostatic chuck 116 from the RF power source 124** for bias, the ions are attracted to the substrate W side to be accelerated with strong directivity and deposited on the substrate W. As a result, film formation of sputtered particles is performed.

Figure 3:
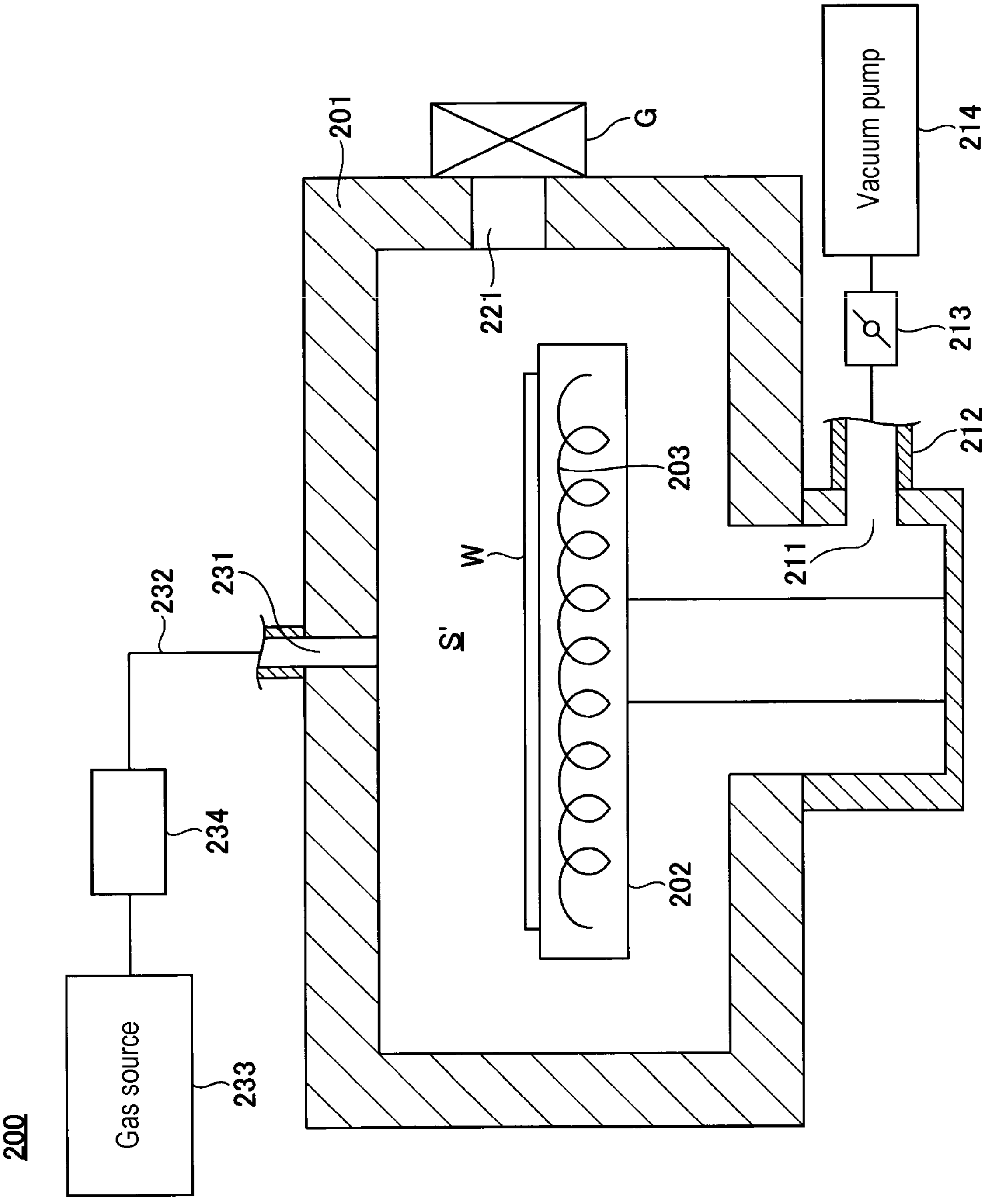
FIG. 3 is an example of a cross-sectional view of an oxidation apparatus.

Next, the oxidation apparatus 200 will be described as an example of the processing chamber PM. FIG. 3 is an example of a cross-sectional view of an oxidation apparatus.

FIG. 3 is a sectional view illustrating an example of an oxidation apparatus. This oxidation apparatus includes a processing container 201 formed in a cylindrical shape from, for example, aluminum or the like. Inside the processing container 201, a stage 202 which is made of ceramic such as AlN and on which a substrate W is placed is disposed, and a heater 203 is provided in the stage 202. The heater 203 generates heat by being supplied with power from a heater power (not illustrated). The stage 202 is provided with three substrate support pins (not illustrated) for substrate transportation, which are provided to be capable of protrude and retract with respect to the surface of the stage 202.

An exhaust port 211 is provided in the bottom portion of the processing container 201, and an exhaust pipe 212 is connected to the exhaust port 211. A throttle valve 213 that performs pressure adjustment and a vacuum pump 214 are connected to the exhaust pipe 212, so that the interior of the processing container 201 can be evacuated. Meanwhile, a substrate carry-out/in port 221 is formed in the side wall of the processing container 201, and the substrate carry-out/in port 221 is openable/closable by a gate valve G. Carry-out/in of a substrate W is performed in the state in which the gate valve G is opened.

A gas introduction port 231 is provided in the center of the ceiling wall of the processing container 201. A gas supply pipe 232 is connected to the gas introduction port 231, and a gas source 233 is connected to the gas supply pipe 232 to supply a processing gas used for oxidation. A gas controller 234 including a gas flow rate controller, a valve, and the like is interposed in the gas supply pipe 232.

In the oxidation apparatus configured as described above, the gate valve G is opened, a substrate W is placed on the stage 202 such that the surface of the substrate W to be oxidized (the rear surface of the substrate, which will be described later) faces the processing space S' inside the processing container 201, then the gate valve G is closed, the interior of the processing container 201 is evacuated by the vacuum pump 214 and adjusted to a predetermined pressure by the throttle valve 213, and the substrate W on the stage 202 is heated to a predetermined temperature by the heater 203. Then, a processing gas is supplied from the gas source 233 into the processing container 201 through the gas supply pipe 232 and the gas introduction port 231, and a process of oxidizing a metal film, which will be described later, is performed.

Figure 4:
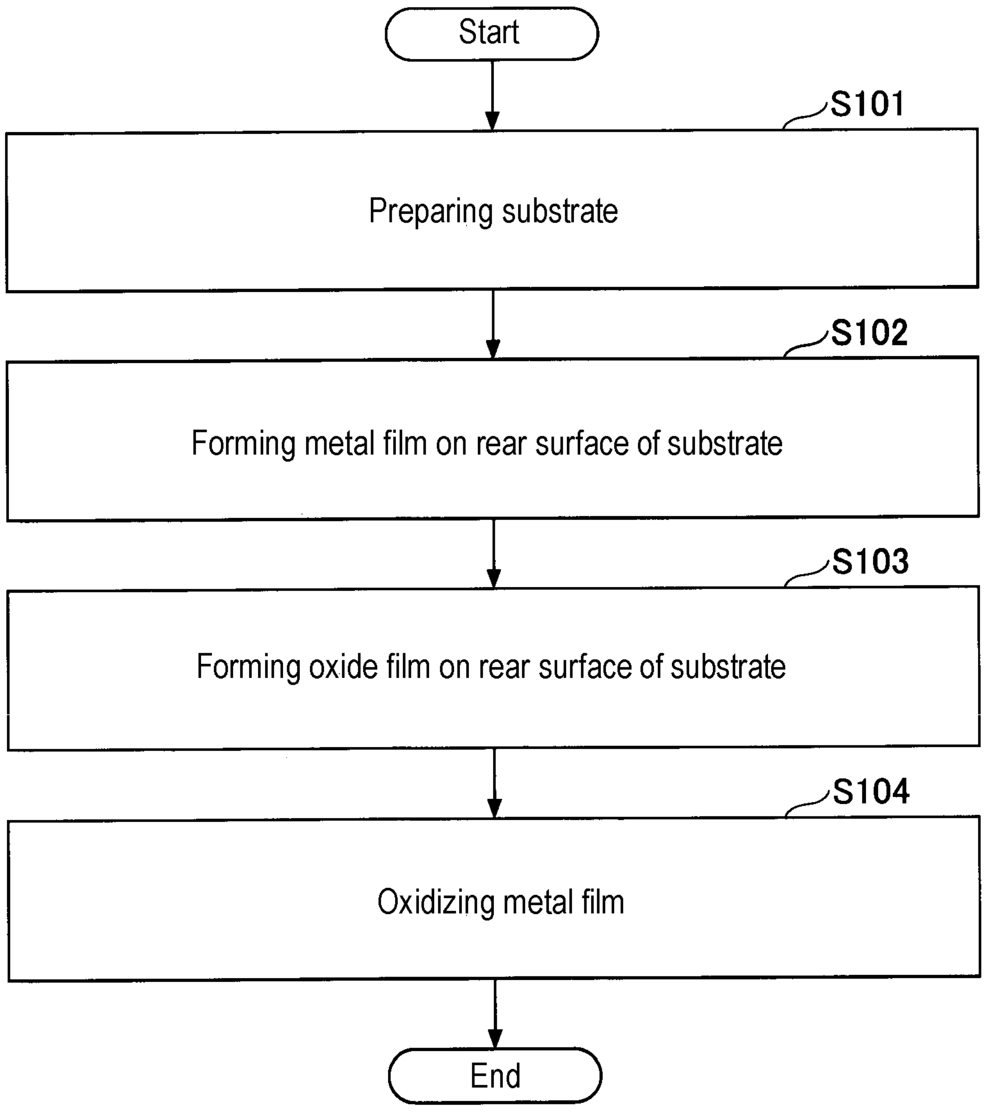
FIG. 4 is an example of a flowchart illustrating an operation of a substrate processing apparatus of a first embodiment.
Figure 5:
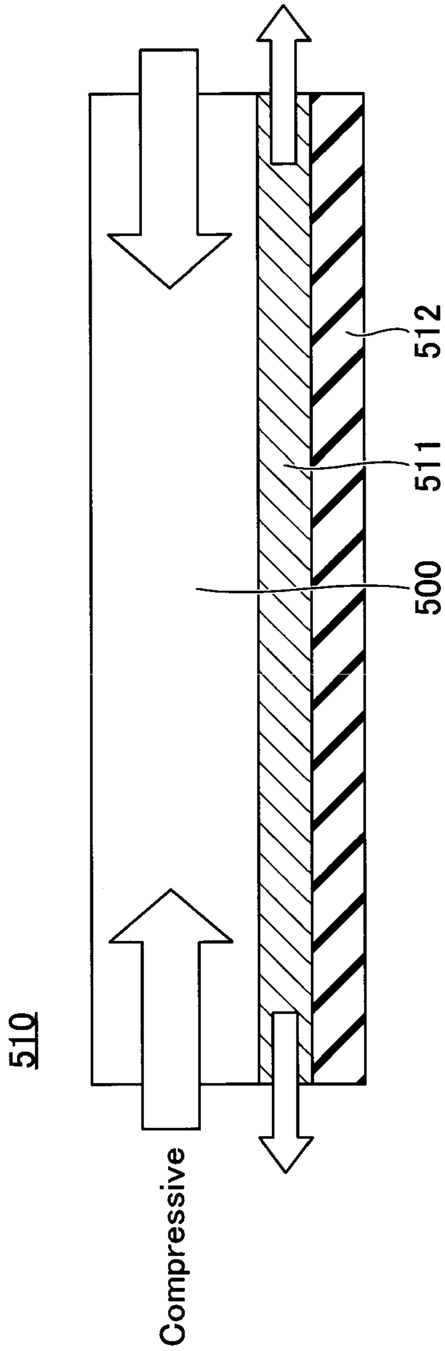
FIG. 5 is an example of a schematic cross-sectional view of a semiconductor substrate processed by the substrate processing apparatus of the first embodiment.

Next, an example of a process of applying stress to a substrate W by the substrate processing apparatus 10 will be described with reference to FIGS. 4 and 5. FIG. 4 is an example of a flowchart illustrating the operation of a substrate processing apparatus 10 of a first embodiment. FIG. 5 is an example of a schematic cross-sectional view of a semiconductor substrate 510 processed by the substrate processing apparatus 10 of the first embodiment.

In step S101, a semiconductor substrate 500 (a substrate W) is prepared. Here, the semiconductor substrate 500 is accommodated in a FOUP 5.

Here, on one surface of the semiconductor substrate 500, a metal wiring line is formed. In the following description, the surface on which the metal wiring line is formed will be referred to as a front surface of the semiconductor substrate 500, and the surface opposite to the front surface on which the metal wiring line is formed will be referred to as a rear surface of the semiconductor substrate 500. The metal wiring line is made of a metal material such as copper (Cu), ruthenium (Ru), cobalt (Co), or the like.

In step S102, a metal film 511 is formed on the rear surface of the semiconductor substrate 500. Here, the processing chamber PM1 of the substrate processing apparatus 10 is a film forming apparatus 100 (see FIG. 2). The controller 6 controls the substrate transport mechanisms 7 and 9 to transport the semiconductor substrate 500 to the processing chamber PM1. The controller 6 controls the processing chamber PM1 (the film forming apparatus 100) to form a metal film 511 on the rear surface of the semiconductor substrate 500.

Here, as the metal film 511, a film of a metal material, which expands in volume when the metal film 511 is oxidized, is formed. For example, vanadium (V) and tungsten (W) may be used as the metal material, the volume of which expands when oxidized.

In step S103, an oxide film (a protective film) 512 is formed on the rear surface of the semiconductor substrate 500. Here, the processing chamber PM2 of the substrate processing apparatus 10 is a film forming apparatus 100 (see FIG. 2). The controller 6 controls the substrate transport mechanism 7 to transport the semiconductor substrate 500 to the processing chamber PM2. The controller 6 controls the processing chamber PM2 (the film forming apparatus 100) to form an oxide film 512 covering the surface of the metal film 511 formed on the rear surface of the semiconductor substrate 500.

Here, the oxide film 512 functions as a protective film that covers the metal film 511. In addition, the oxide film 512 allows oxygen (O) to permeate therethrough. The oxide film 512 is made of, for example, zirconia ($ZnO_2$), hafnia ($HfO_2$), or a composite compound thereof.

In step S104, the metal film 511 is oxidized. Here, the processing chamber PM3 of the substrate processing apparatus 10 is an oxidation apparatus 200 (see FIG. 3). The controller 6 controls the substrate transport mechanism 7 to transport the semiconductor substrate 500 to the processing chamber PM3. The controller 6 controls the processing chamber PM3 (the oxidation apparatus 200) to oxidize the metal film 511.

Thereafter, the controller 6 controls the substrate transport mechanisms 7 and 9 to accommodate the processed semiconductor substrate 510 in the FOUP 5.

As illustrated in FIG. 5, the metal film 511 formed on the rear surface of the semiconductor substrate 500 is oxidized and expands in volume, in other words, generates outward stress (see the white arrows). As a result, compressive stress can be applied to the semiconductor substrate 500 (see the white arrows of “Compressive”).

For example, when the semiconductor substrate 500 is warped in a convex shape, the warp of the semiconductor substrate 500 can be reduced by applying compressive stress to the semiconductor substrate 500.

In addition, a metal wiring line is formed on the semiconductor substrate 500. As the metal wiring line becomes finer, the line width becomes narrower than the mean free path of electrons in the metal, and the wiring resistance increases. Moreover, since the pitch between wiring lines becomes narrower, it is required to suppress the migration of metal atoms.

Figure 6A:
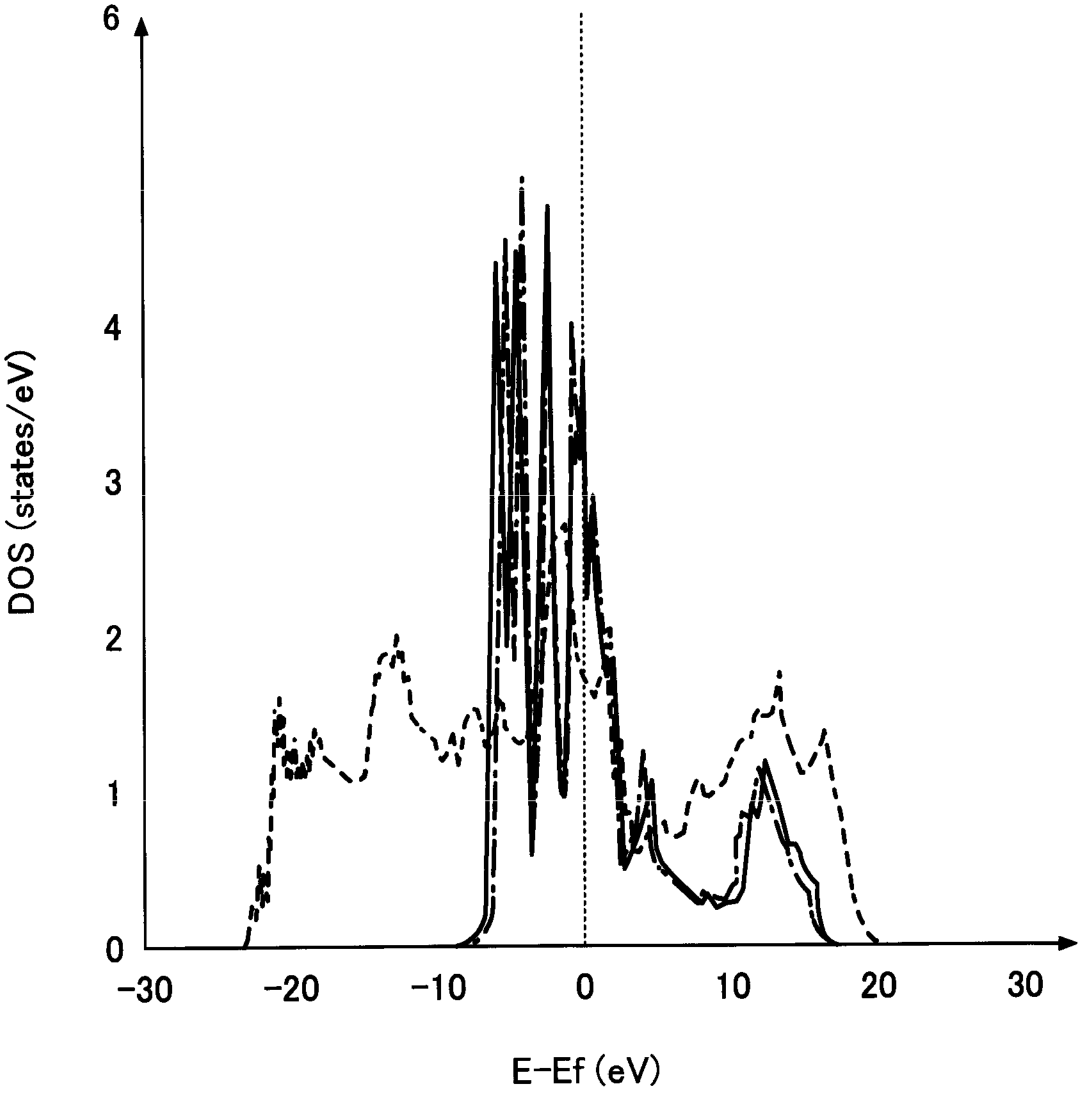
FIG. 6A is an example of a graph showing the density of states of Ru.
Figure 6B:
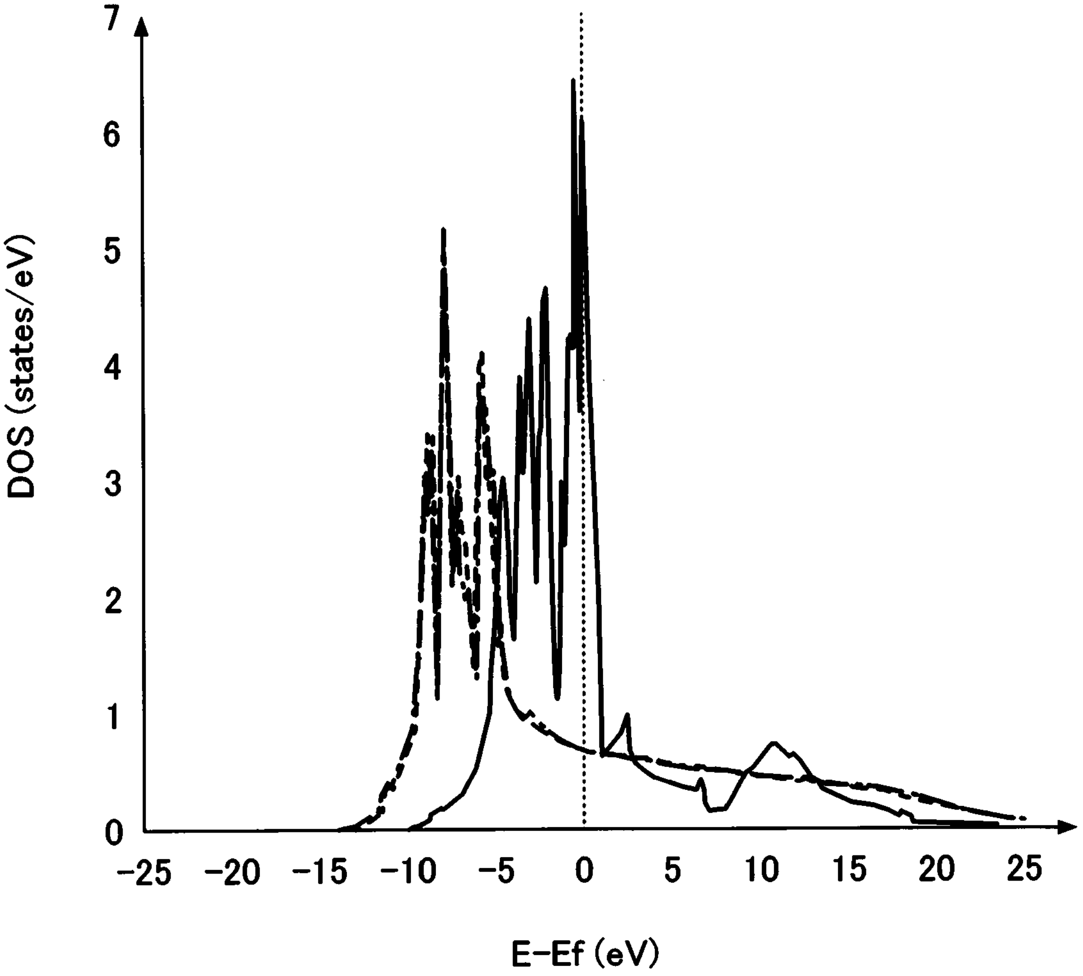
FIG. 6B is an example of a graph showing the density of states of Co.

FIG. 6A is an example of a graph showing the density of states of Ru. FIG. 6B is an example of a graph showing the density of states of Co. The vertical axis represents the density of states (DOS), and the horizontal axis represents the energy (E–Ef) with the Fermi level set to 0. A dashed lines indicates the density of states when no stress is applied, a one-dot chain line indicates the density of states when pressurized at 10 GPa in a uniaxial direction, and a solid lines indicate the density of states when pressurized isotropically at 10 GPa.

Here, conductivity σ is represented by the following equation. Here, e denotes elementary charge, μ denotes mobility, n denotes carrier density, and ρ denotes resistivity.

$$\sigma = e\,\mu n = 1/\rho$$

As shown in FIG. 6A, at the Fermi level (E–Ef=0), the density of states of Ru is increased when pressurized in a uniaxial direction (one-dot chain line) and pressurized isotropically (solid line) compared to the case where no stress is applied. In other words, the electron carrier density n that contributes to electrical conduction increases. As a result, the conductivity σ can be increased.

As shown in FIG. 6B, at the Fermi level (E–Ef=0), the density of states of Co is increased when isotropically pressurized (solid line) compared to the case where no stress is applied. In other words, the electron carrier density n that contributes to electrical conduction increases. As a result, the conductivity σ can be increased.

In this way, by applying compressive stress to the semiconductor substrate 500, the resistance of the metal wiring lines formed on the semiconductor substrate 500 can be reduced.

Furthermore, by applying compressive stress to the semiconductor substrate 500, internal stress is generated as a drag force in the metal crystals of the metal wiring lines. This drag force suppresses the movement of metal atoms. Therefore, the migration of metal atoms can be suppressed.

Figure 7:
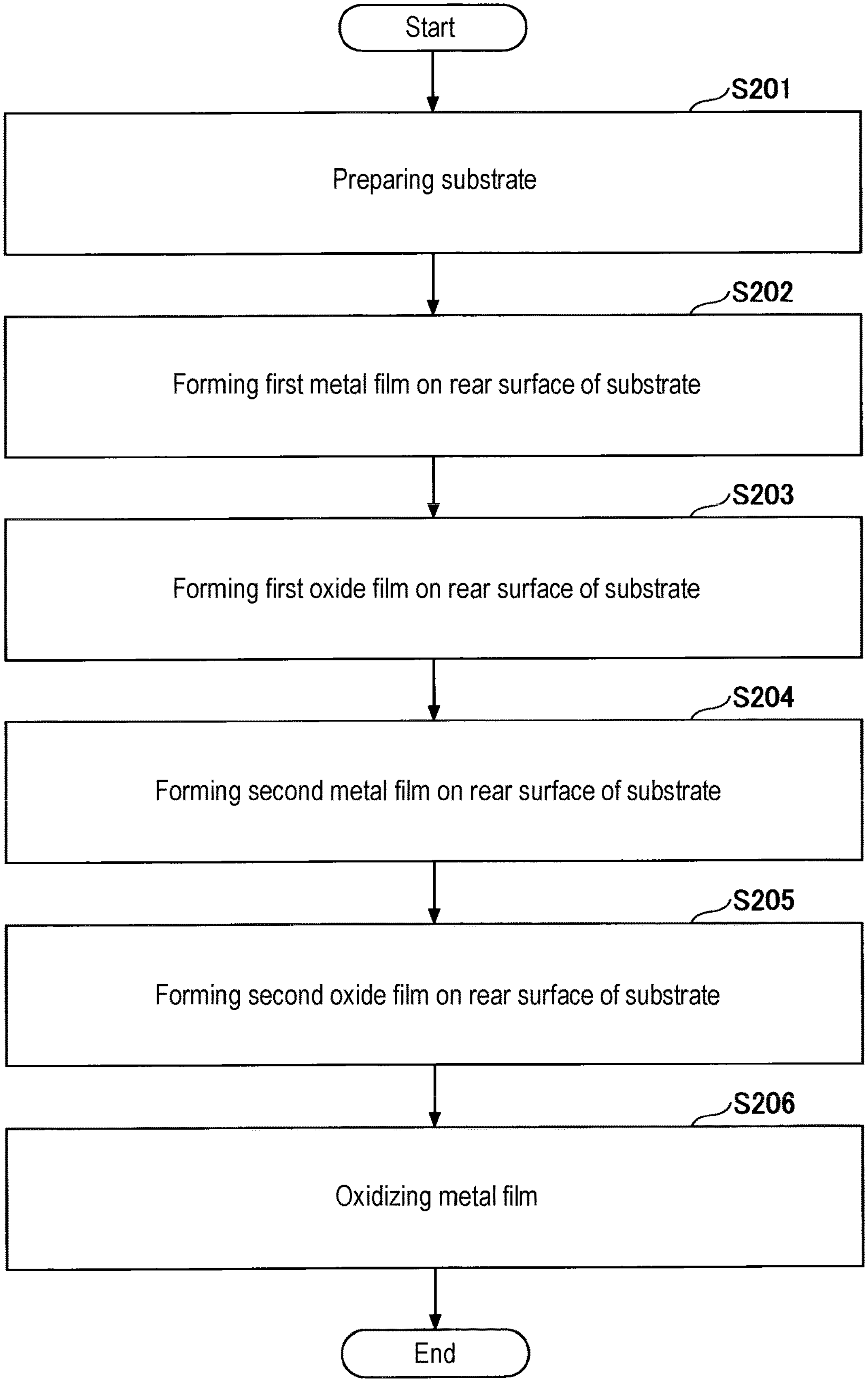
FIG. 7 is an example of a flowchart illustrating the operation of a substrate processing apparatus of a second embodiment.
Figure 8:
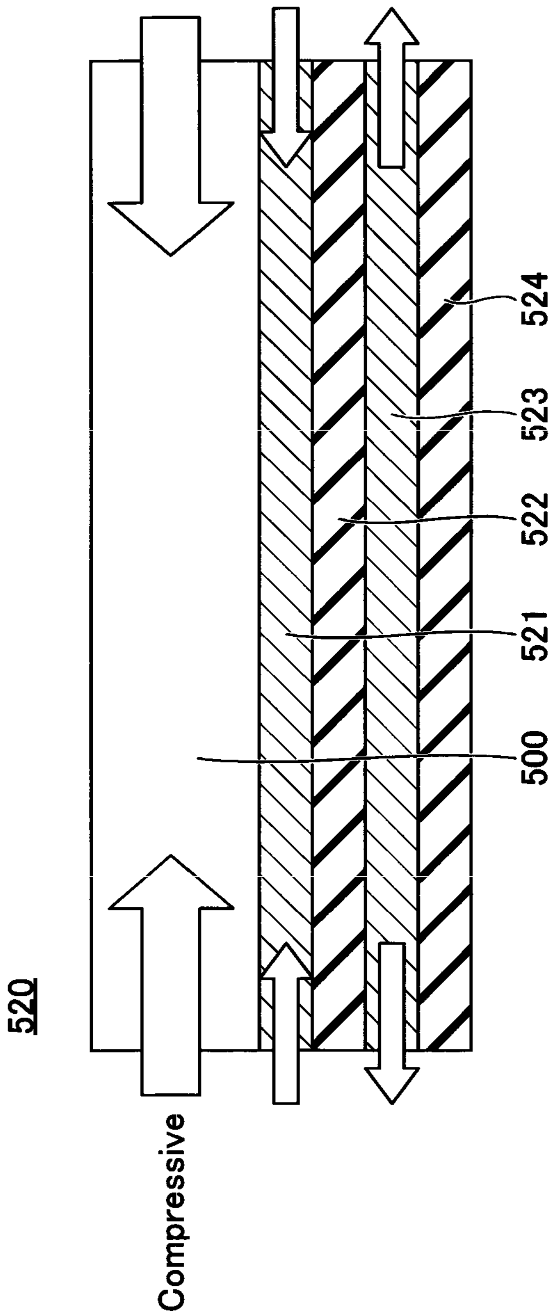
FIG. 8 is an example of a schematic cross-sectional view of a semiconductor substrate processed by the substrate processing apparatus of the second embodiment.

Next, another example of a process of applying stress to a substrate W by the substrate processing apparatus 10 will be described with reference to FIGS. 7 and 8. FIG. 7 is an example of a flowchart illustrating the operation of a substrate processing apparatus 10 of a second embodiment. FIG. 8 is an example of a schematic cross-sectional view of a semiconductor substrate 520 processed by the substrate processing apparatus 10 of the second embodiment.

In step S201, a semiconductor substrate 500 (a substrate W) is prepared. Here, the semiconductor substrate 500 is accommodated in a FOUP 5.

Here, on one surface of the semiconductor substrate 500, a metal wiring line is formed. In the following description, the surface on which the metal wiring line is formed will be referred to as a front surface of the semiconductor substrate 500, and the surface opposite to the front surface on which the metal wiring line is formed will be referred to as a rear surface of the semiconductor substrate 500.

In step S202, a first metal film 521 is formed on the rear surface of the semiconductor substrate 500. Here, the processing chamber PM4 of the substrate processing apparatus 10 is a film forming apparatus 100 (see FIG. 2). The controller 6 controls the substrate transport mechanisms 7 and 9 to transport the semiconductor substrate 500 to the processing chamber PM4. The controller 6 controls the processing chamber PM4 (the film forming apparatus 100) to form a first metal film 521 on the rear surface of the semiconductor substrate 500.

Here, as the first metal film 521, a film of a metal material, which contracts in volume when the first metal film 521 is oxidized, is formed. For example, magnesium (Mg) and strontium (Sr) may be used as the metal material, the volume of which contracts when oxidized.

In step S203, a first oxide film (a protective film) 522 is formed on the rear surface of the semiconductor substrate 500. Here, the processing chamber PM2 of the substrate processing apparatus 10 is a film forming apparatus 100 (see FIG. 2). The controller 6 controls the substrate transport mechanism 7 to transport the semiconductor substrate 500 to the processing chamber PM2. The controller 6 controls the processing chamber PM2 (the film forming apparatus 100) to form the first oxide film 522 covering the front surface of the first metal film 521 formed on the rear surface of the semiconductor substrate 500.

Here, the first oxide film 522 functions as a protective film that covers the first metal film 521. In addition, the first oxide film 522 allows oxygen to permeate therethrough. The first oxide film 522 is made of, for example, zirconia ($ZnO_2$), hafnia ($HfO_2$), or a composite compound thereof.

In step S204, a second metal film 523 is formed on the rear surface of the semiconductor substrate 500. Here, the processing chamber PM1 of the substrate processing apparatus 10 is a film forming apparatus 100 (see FIG. 2). The controller 6 controls the substrate transport mechanism 7 to transport the semiconductor substrate 500 to the processing chamber PM1. The controller 6 controls the processing chamber PM1 (the film forming apparatus 100) to form a second metal film 523 on the rear surface of the semiconductor substrate 500.

Here, as the second metal film 523, a film of a metal material, which expands in volume when the second metal film 523 is oxidized, is formed. For example, vanadium (V) and tungsten (W) may be used as the metal material, the volume of which expands when oxidized.

In step S205, a second oxide film (a protective film) 524 is formed on the rear surface of the semiconductor substrate 500. Here, the processing chamber PM2 of the substrate processing apparatus 10 is a film forming apparatus 100 (see FIG. 2). The controller 6 controls the substrate transport mechanism 7 to transport the semiconductor substrate 500 to the processing chamber PM2. The controller 6 controls the processing chamber PM2 (the film forming apparatus 100) to form the second oxide film 524 covering the front surface of the second metal film 523 formed on the rear surface of the semiconductor substrate 500.

Here, the second oxide film 524 functions as a protective film that covers the second metal film 523. In addition, the second oxide film 524 allows oxygen to permeate therethrough. The second oxide film 524 is made of, for example, zirconia ($ZnO_2$), hafnia ($HfO_2$), or a composite compound thereof.

In step S206, the first metal film 521 and the second metal film 523 are oxidized. Here, the processing chamber PM3 of the substrate processing apparatus 10 is an oxidation apparatus 200 (see FIG. 3). The controller 6 controls the substrate transport mechanism 7 to transport the semiconductor substrate 500 to the processing chamber PM3. The controller 6 controls the processing chamber PM3 (the oxidation apparatus 200) to oxidize the first metal film 521 and the second metal film 523.

Thereafter, the controller 6 controls the substrate transport mechanisms 7 and 9 to accommodate the processed semiconductor substrate 510 in the FOUP 5.

As illustrated in FIG. 8, the first metal film 521 formed on the rear surface of the semiconductor substrate 500 is oxidized and contracts in volume, in other words, generates inward stress (see the white arrows of the first metal film 521). In addition, the second metal film 523 is oxidized and expands in volume, in other words, generates outward stress (see the white arrows of the second metal film 523). As a result, compressive stress applied to the semiconductor substrate 500 can be increased (see the white arrows of "Compressive").

For example, when the semiconductor substrate 500 is warped in a convex shape, the warp of the semiconductor substrate 500 can be reduced by applying compressive stress to the semiconductor substrate 500.

In addition, by applying compressive stress to the semiconductor substrate 500, the resistance of the metal wiring lines formed on the semiconductor substrate 500 can be reduced. Furthermore, by applying compressive stress to the semiconductor substrate 500, internal stress is generated as a drag force in the metal crystals of the metal wiring lines. This drag force suppresses the movement of metal atoms. Therefore, the migration of metal atoms can be suppressed.

Next, another example of a process of applying stress to a substrate W by the substrate processing apparatus 10 will be described with reference to FIGS. 9 and 10.

Figure 9:
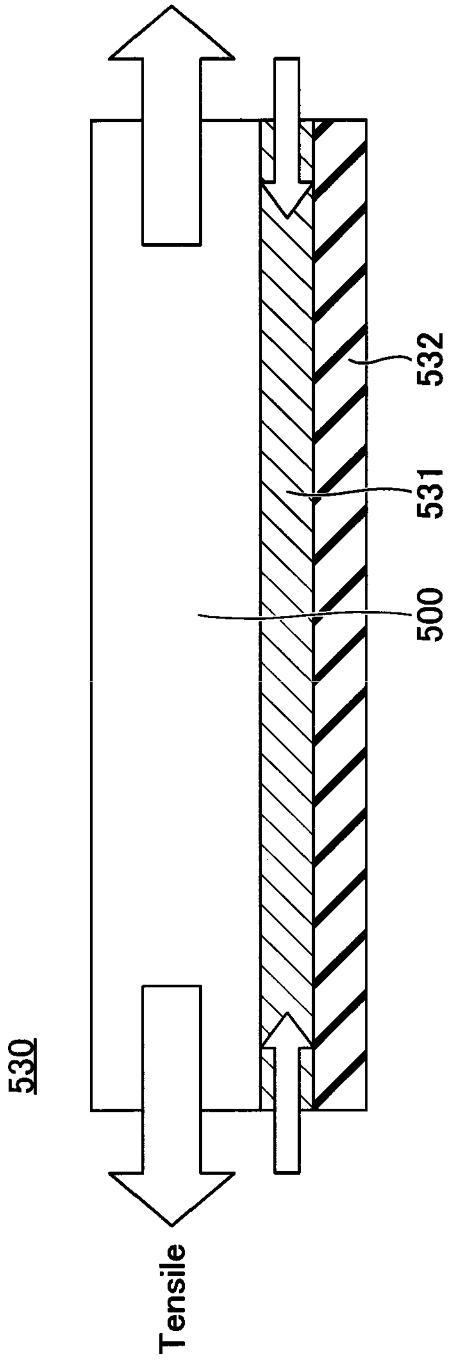
FIG. 9 is an example of a schematic cross-sectional view of a semiconductor substrate processed by a substrate processing apparatus of a third embodiment.

FIG. 9 is an example of a schematic cross-sectional view of a semiconductor substrate 530 processed by a substrate processing apparatus 10 of a third embodiment.

The processed semiconductor substrate 530 includes a semiconductor substrate 500, a metal film 531, and an oxide film 532. Here, as the metal film 531, a film of a metal material, which contracts in volume when the metal film 531 is oxidized, is formed. Others are the same as the flow illustrated in FIG. 4, and a redundant description is omitted.

As illustrated in FIG. 9, the metal film 531 formed on the rear surface of the semiconductor substrate 500 is oxidized and contracts in volume, in other words, generates inward stress (see the white arrows of the metal film 531). As a result, tensile stress can be applied to the semiconductor substrate 500 (see the white arrows of "Tensile").

For example, when the semiconductor substrate 500 is warped in a concave shape, the warp of the semiconductor substrate 500 can be reduced by applying tensile stress to the semiconductor substrate 500.

Figure 10:
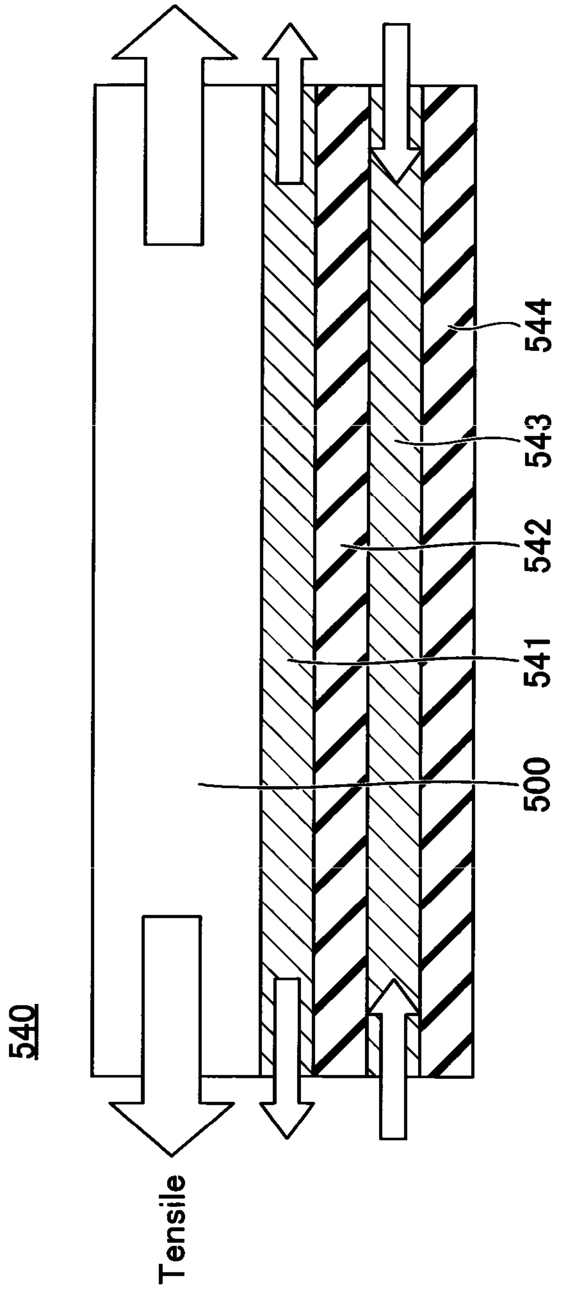
FIG. 10 is an example of a schematic cross-sectional view of a semiconductor substrate processed by a substrate processing apparatus of a fourth embodiment.

FIG. 10 is an example of a schematic cross-sectional view of a semiconductor substrate 540 processed by a substrate processing apparatus 10 of a fourth embodiment.

The processed semiconductor substrate 540 includes a semiconductor substrate 500, a first metal film 541, a first oxide film 542, a second metal film 543, and a second oxide film 544. Here, as the first metal film 541, a film of a metal material, which expands in volume when the first metal film 541 is oxidized, is formed. As the second metal film 543, a film of a metal material, which contracts in volume when the second metal film 543 is oxidized, is formed. Others are the same as the flow illustrated in FIG. 7, and a redundant description is omitted.

As illustrated in FIG. 10, the first metal film 541 formed on the rear surface of the semiconductor substrate 500 is oxidized and expands in volume, in other words, generates outward stress (see the white arrows of the first metal film 541). In addition, the second metal film 543 is oxidized and contracts in volume, in other words, generates inward stress (see the white arrows of the second metal film 543). As a result, tensile stress applied to the semiconductor substrate 500 can be increased (see the white arrows of "Tensile").

For example, when the semiconductor substrate 500 is warped in a concave shape, the warp of the semiconductor substrate 500 can be reduced by applying tensile stress to the semiconductor substrate 500.

In the foregoing, substrate processing apparatuses 10 according to the embodiments have been described, but the present disclosure is not limited to the above-described embodiments or the like, and can be variously modified and improved within the scope of the present disclosure described in the claims.

Although the oxidation apparatus 200 (the processing chamber PM3) that performs oxidation has been described with the oxidation apparatus 200 illustrated in FIG. 3 as an example, the present disclosure is not limited thereto. The oxidation apparatus may be an apparatus that oxidizes a metal film by using any one of an oxygen plasma, active oxygen, and thermal oxidation.

In addition, the substrate processing apparatus 10 may include a reduction apparatus (not illustrated) for reducing a metal film in addition to the oxidation apparatus for oxidizing a metal film. The reduction apparatus may be an apparatus that reduces a metal film by using a hydrogen plasma, active hydrogen, or heated hydrogen. As a result, the oxidized state of a metal film can be adjusted. That is, the stress applied to a semiconductor substrate 500 can be adjusted by adjusting the oxidized state of a metal film. The oxidation apparatus and the reduction apparatus may be different apparatuses, or may be a single oxidation-reduction apparatus.

In addition, an oxidation apparatus (a reduction apparatus or an oxidation-reduction treatment apparatus) may include a spectroscope (not illustrated) configured to emit spectrally divided light to a metal film, a detector (not illustrated) configured to detect light reflected from the metal film, and a stress estimator (not illustrated) configured to estimate a distribution of stress applied to the substrate by the metal film based on the light absorption spectrum of the reflected light detected by the detector. Here, when, for example, tungsten (W) or vanadium (V) is used as a metal film, oxides thereof, $WO_3$ and $W_2O_5$, have electrochromic property and light absorption changes depending on the oxidized/reduced state. Therefore, by using the electrochromic property, the oxidized/reduced state of a metal film can be monitored over the entire surface of a substrate W from the absorption spectrum of reflected light detected by the detector to be used as an index of an in-plane stress distribution.

The present application claims priority based on Japanese Patent Application No. 2021-7405 filed on Jan. 20, 2021, the disclosure of which is incorporated herein in its entirety by reference.

EXPLANATION OF REFERENCE NUMERALS

500: semiconductor substrate, 510, 520, 530, 540: semiconductor substrate, 511: metal film, 512: oxide film, 521: first metal film, 522: first oxide film, 523: second metal film, 524: second oxide film, 531: metal film, 532: oxide film, 541: first metal film, 542: first oxide film, 543: second metal film, 544: second oxide film

What is claimed is:

1. A substrate processing method comprising:

forming a metal film, which changes in volume when oxidized, on a rear surface of a substrate;

forming an oxide film, through which oxygen permeates, on a front surface of the metal film; and applying stress to the substrate by oxidizing the metal film.

2. The substrate processing method of claim 1, wherein the metal film expands in volume when oxidized and applies compressive stress to the substrate by being oxidized.

3. The substrate processing method of claim 2, wherein the metal film, which expands in volume when oxidized, is tungsten or vanadium.

4. The substrate processing method of claim 2, wherein the substrate includes a metal wiring line on a front surface of the substrate.

5. The substrate processing method of claim 1, wherein the metal film contracts in volume when oxidized and applies tensile stress to the substrate by being oxidized.

6. The substrate processing method of claim 5, wherein the metal film, which contracts in volume when oxidized, is magnesium or strontium.

7. The substrate processing method of claim 1, wherein the oxide film is zirconia, hafnia, or a composite compound of zirconia and hafnia.

8. A substrate processing method comprising:

forming a first metal film, which changes in volume when oxidized, on a rear surface of a substrate;

forming a first oxide film, through which oxygen permeates, on a front surface of the first metal film;

forming a second metal film, which changes in volume, on a front surface of the first oxide film;

forming a second oxide film, through which oxygen permeates, on a front surface of the second metal film; and applying stress to the substrate by oxidizing the first metal film and the second metal film.

9. The substrate processing method of claim 8, wherein the first metal film contracts in volume when oxidized, and the second metal film expands in volume when oxidized and applies compressive stress to the substrate by being oxidized.

10. The substrate processing method of claim 9, wherein the metal film, which expands in volume when oxidized, is tungsten or vanadium.

11. The substrate processing method of claim 9, wherein the metal film, which contracts in volume when oxidized, is magnesium or strontium.

12. The substrate processing method of claim 5, wherein the substrate includes a metal wiring line on a front surface of the substrate.

13. The substrate processing method of claim 8, wherein the first metal film expands in volume when oxidized, and the second metal film contracts in volume when oxidized and applies tensile stress to the substrate by being oxidized.

14. The substrate processing method of claim 13, wherein the metal film, which expands in volume when oxidized, is tungsten or vanadium.

15. The substrate processing method of claim 13, wherein the metal film, which contracts in volume when oxidized, is magnesium or strontium.

16. The substrate processing method of claim 8, wherein the oxide film is zirconia, hafnia, or a composite compound of zirconia and hafnia.

* * * * *